United States Patent [19]

Horiuchi et al.

[11] Patent Number: 4,604,572
[45] Date of Patent: Aug. 5, 1986

[54] DEVICE FOR TESTING SEMICONDUCTOR DEVICES AT A HIGH TEMPERATURE

[75] Inventors: Akinori Horiuchi, Tokyo; Toshio Binnaka, Kawasaki; Shigeyuki Maruyama, Yokohama, all of Japan

[73] Assignee: Fujitsu Limited, Kawasaki, Japan

[21] Appl. No.: 673,203

[22] Filed: Nov. 19, 1984

Related U.S. Application Data

[63] Continuation of Ser. No. 395,906, Jul. 7, 1982, abandoned.

[30] Foreign Application Priority Data

Jul. 8, 1981 [JP] Japan ............... 56-102058[U]
Jul. 31, 1981 [JP] Japan ............... 56-113863[U]

[51] Int. Cl.4 ............... G01R 31/26; G01R 31/28
[52] U.S. Cl. ............... 324/158 F; 324/73 AT; 324/158 R
[58] Field of Search ............... 324/158 F, 158 P, 72.5, 324/158 R, 73 AT, 73 R; 198/349; 209/573; 269/21

[56] References Cited

U.S. PATENT DOCUMENTS 3,039,604  6/1962  Bickel et al. ............... 209/573
3,437,929  4/1969  Glenn ............... 324/72.5
3,979,671  9/1976  Meeker et al. ............... 324/158 F Primary Examiner—Ernest F. Karlsen
Attorney, Agent, or Firm—Staas & Halsey

[57] ABSTRACT

Apparatus for testing semiconductor devices at a high temperature comprising: a heating portion where the semiconductor device to be tested is heated to a predetermined temperature; a testing portion; a assembly for holding the chucking semiconductor device, the chucking assembly having a heating element for heating the semiconductor device and a thermosensor; a conveyor assembly for conveying the semiconductor device chucked by the chucking assembly to the testing portion; and, a central processing unit and memory circuit for controlling the temperature of the heating element in response to the output of the thermosensor.

10 Claims, 5 Drawing Figures

DEVICE FOR TESTING SEMICONDUCTOR DEVICES AT A HIGH TEMPERATURE

This is a continuation of co-pending application Ser. No. 395,906 filed on July 7, 1982, now abandoned.

BACKGROUND OF THE INVENTION

The present invention relates to a device for testing semiconductor devices at a high temperature and especially to improved ways of maintaining a high temperature and of easy positioning the semiconductor device.

Before being put on the market, semiconductor devices, such as integrated circuit (IC) devices, are rigorously tested. They are tested not only at a normal temperature of about 25° C. but also at a high temperature of about 70° C. to 120° C., particularly in the case of transistors of high quality, IC's, or microcomputers. Defects in such semiconductor devices are easily found at a high temperature owing to the semiconductor devices being easily degraded at a high temperature. Direct current tests of $V_{CBO}$, $V_{EBO}$, $V_{OH}$, or $V_{OL}$ and function tests are conducted at a high temperature. However, the tester must be kept at a normal temperature so as to avoid degradation of the testing ability thereof. Therefore, the semiconductor device to be tested is heated at a heating station and then is quickly conveyed to the predetermined position of the tester. During conveyance, the semiconductor device undergoes a sudden change of temperature, and, as a result, the reliability of the test results is decreased.

When testing is conducted by using an automatic device for testing semiconductor devices such as IC's and LSI's, the semiconductor device to be tested is conveyed from a first place to a second place by an arm of an auto-handler. Such an auto-handler must comprise a special, highly accurate positioning mechanism for positioning the semiconductor device at a predetermined testing position. A conventional servo-mechanism cannot be utilized to position the semiconductor device at a predetermined testing position since it is not highly accurate. The inclusion of a special positioning mechanism in the auto-handler, therefore, increases the cost of the automatic testing device.

A dual in-line type of semiconductor package, i.e. one type of semiconductor device, comprises a plurality of leads which project downward from either of the longitudinal side surfaces of the box-shaped molded package body. Such a dual in-line type of semiconductor package can be conveyed by simply sliding it along a guide rail, the width of which is slightly narrower than the distance between the rows of leads of both sides of the package body. Lowering of the temperature of the heated package while it is being conveyed can be avoided by heating the guide rail. the package can be placed in a predetermined position after the conveyance thereof by accurately forming the guide rail.

However, such a guide rail means cannot be used in the testing of: a repeated in-line type (RIT) of semiconductor package which comprises many rows of leads projecting from the bottom surface thereof; a flat semiconductor package, the leads of which project parallel to the bottom surface thereof; or a leadless chip carrier in which films of electrodes are formed on the package surface. In such cases, the semiconductor device to be tested must be held by a chucking means, such as a vacuum chuck, provided on an arm of the auto-handler and then must be conveyed from the heating station to the tester. The temperature of the heated semiconductor device is lowered during the conveyance thereof and accurate positioning of the semiconductor device at the tester is not easily achieved. Thus, the reliability of the test results is lowered and an expensive, accurate positioning mechanism is necessitated.

OBJECTS OF THE INVENTION

An object of the present invention is to provide a device for testing semiconductor devices at a high temperature, especially for RIT semiconductor packages, flat semiconductor packages, and leadless chip carriers, in which lowering of the temperature of the semiconductor device to be tested is avoided during the conveyance thereof from the heating station to the testing position.

Another object of the present invention is to provide a device for testing semiconductor devices at a high temperature, in which the semiconductor device to be tested can be easily and accurately placed in a predetermined position.

SUMMARY OF THE INVENTION

The first object of the present invention can be achieved by a device for testing semiconductor devices at a high temperature, the testing device comprising: a heating portion where the semiconductor device to be tested is heated to a predetermined temperature; a testing portion; means for chucking said semiconductor device, the chucking means comprising means for conveying said semiconductor device and a thermosensor; means for conveying said semiconductor device chucked by the chucking means to the testing portion; and means for controlling the temperature of the heating means in response to the output of said thermosensor.

BRIEF DESCRIPTION OF THE DRAWINGS

Embodiments of the present invention will now be described with reference to the accompanying drawings, in which.

DETAILED DESCRIPTION OF THE PREFERRED EMBODIMENTS

Figure 1:
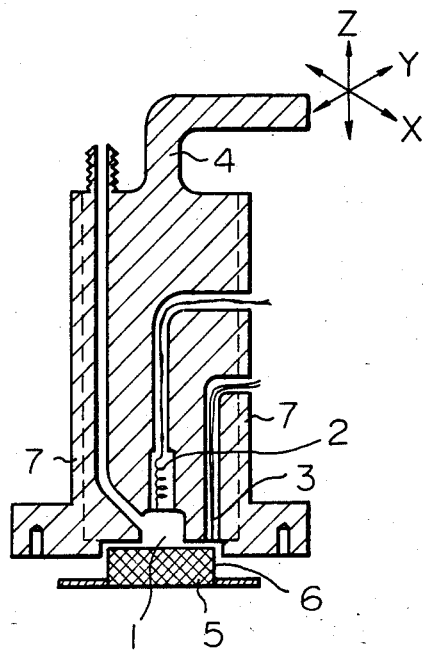
FIG. 1 is a sectional view of a vacuum chuck for the testing device according to the present invention.

An example of a vacuum chuck of the testing device for holding a semiconductor device is illustrated in section in FIG. 1. The dimension of the vacuum chuck is about 20~30 mm² at the main horizontal section and 70 mm in height.

A vacuum port 1 is formed at the center of the bottom of the vacuum chuck. A heater 2 is positioned within the vacuum chuck adjacent to vacuum port 1. Thermosensor 3, e.g., a thermocouple, is disposed near heater 2. The vacuum chuck is moved in the direction of X, Y, and Z by arm 4 connected to the upper end therof so as to reciprocate between a pallet (not shown) on which the heated semiconductor device is placed and a socket of the testing portion (not shown) on which the semiconductor device is conveyed. Sucking area 6 communicates with vacuum port 1. The size and the shape of sucking area 6 can be changed by exchanging outer frame 7 for another outer frame of a different size and shape so as to hold semiconductors of various shapes and sizes. A microcomputer (not shown) controls the movement of arm 4, the vacuum pressure introduced, and the begin and end signals for testing. The microcomputer of the present invention further controls the circumferential temperature of the semiconductor device held by the vacuum chuck. The vacuum chuck can easily be cooled due to its small thermal capacity and rapid moveability. It is difficult to maintain the temperature of the vacuum chuck at a predetermined high temperature simply by turning the heater on at a predetermined temperature and turning it off at another predetermined temperature. For example, when testing is to be conducted at a temperature range of 90°±3° C., the temperature can not maintained within this range by turning the heater on at 87° C. and turning it off at 93° C. The temperature at which the switch of the heater is turned on or off should be changed in accordance with the size and type of the semiconductor device held by the vacuum chuck or in accordance with the vacuum pressure.

Figure 2:
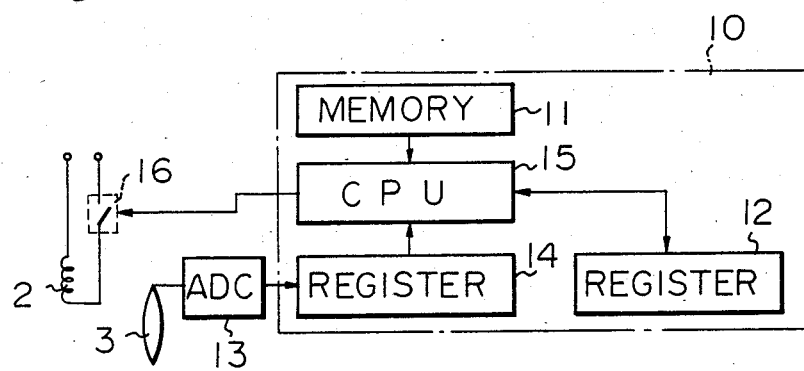
FIG. 2 is a diagram of a circuit for controlling the temperature of the testing device according to the present invention.

A diagram of a circuit for controlling the circumferential temperature of the semiconductor device is depicted in FIG. 2. A microcomputer 10 comprises a memory 11 which memorizes experimental data concerning the relationship between the optimum switching time of the heater and the condition of the vacuum chuck, the temperature of the vacuum chuck, the kind of semiconductor device to be tested, and the setting temperature. The condition of the vacuum chuck and the kind of semiconductor device to be tested are judged by a register 12. The temperature of the vacuum chuck is judged by a thermosensor 3 and the temperature signal is fowarded to a register 14 through an analogue-digital converter (ADC) 13. The temperature is temporarily memorized by register 14. A central processing unit 15 judges the optimum switching time of a switch 16 of heater 2 on the basis the data of memory 11 in response to the input signals from registers 12 and 14. Switch 16 is an analogue switch which functions at a high speed of about 100 ns. Register 12 may be a conventional register which is used to automatically control the movement of the vacuum chuck. Accurate temperature control can be achieved by microcomputer 10, which comprises memory 11 and register 14 connected to thermosensor 3. Testing at a normal temperature can be conducted by continuously turning switch 16 off.

Figure 3:
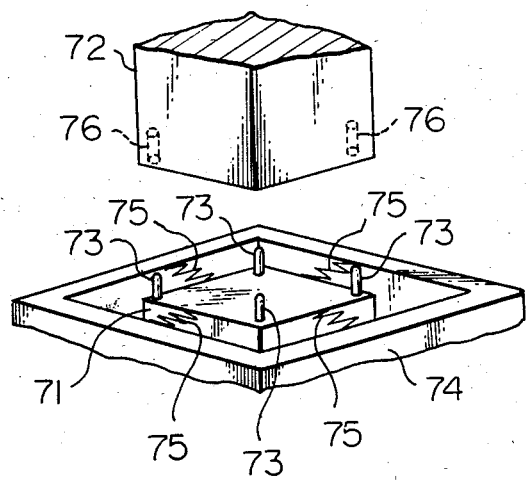
FIG. 3 is a perspective view of a positioning mechanism of the testing device according to the present invention.

A positioning mechanism according to the present invention will be described with reference to FIG. 3. The mechanism has a first member 71 as illustrated in the drawing. A second member 72 is placed on first member 71. First member 71 comprises four guide pins 73 and is supported within a stationary member 74 by four springs 75 so that first member 71 can move along the horizontal floor surface of stationary member 74. Second member 72 comprises four guide grooves 76 corresponding to guide pins 73. Guide pins 73 fit into guide grooves 76 when second member 72 moves down onto first member 71 so that second member 72 is placed at a predetermined position on first member 71. Second member 72 is easily and reliably guided to the predetermined position on first member 71 even if second member 72 slighly diverges from the predetermined position since first member 71 is movable due to springs 75, which compensate for the divergence of second member 72. In addition, if second member 72 is horizontally moved after it is placed on first member 71, the movement is compensated for by springs 75 so that a compulsive force is not generated between first member 71 and second member 72.

Figure 4:
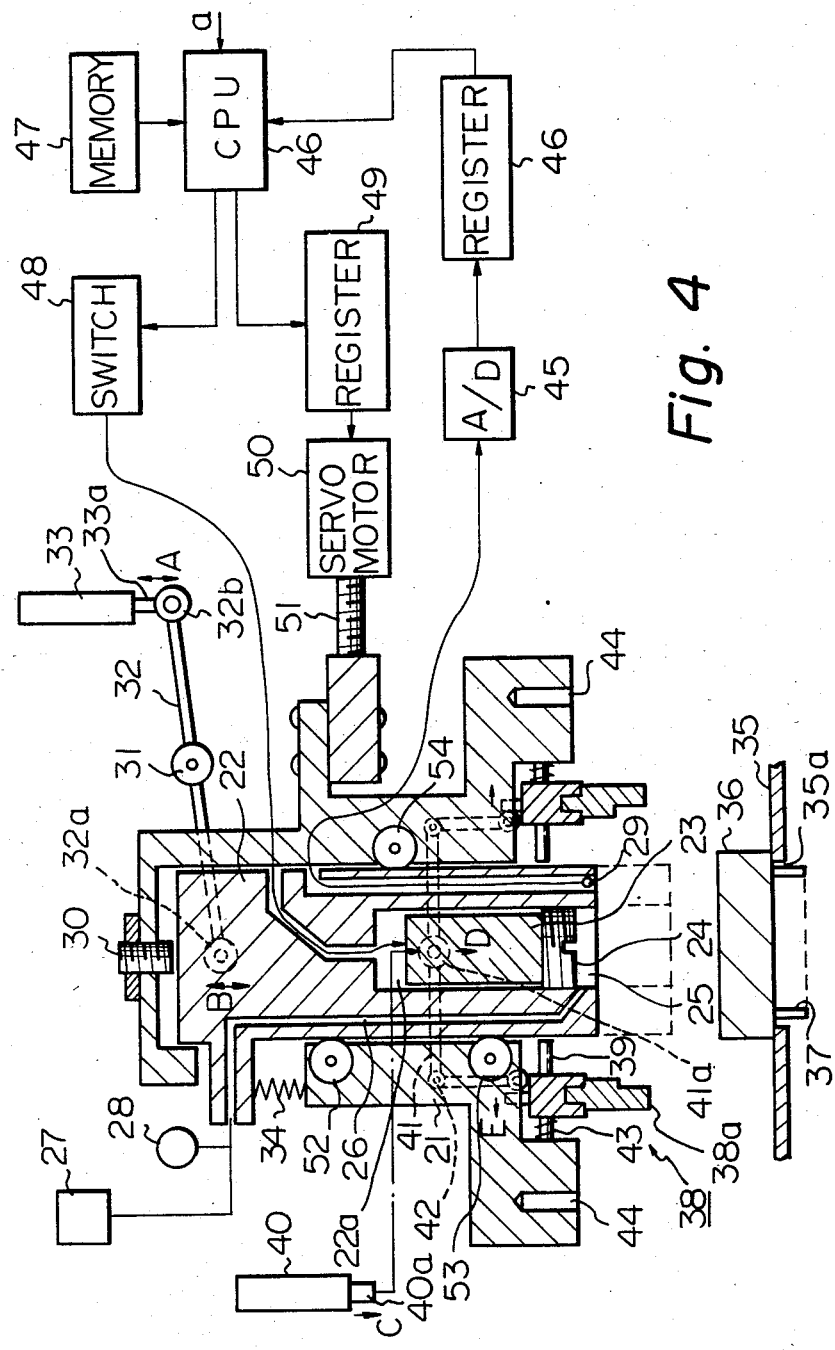
FIG. 4 is a sectional view of another example of the vacuum chuck and a diagram of a circuit for operating the testing device according to the present invention.

Another example of the vacuum chuck of the testing device according to the present invention is illustrated in detail in FIG. 4. Suction block 22 is disposed within main body 21. Suction block 22 can vertically slide within main body 21. Heater block 23 is housed within a hollow 22a of suction block 22. The inlet of hollow 22a is closed by a screw 24. A vacuum passage 26 communicates with the inlet of hollow 22a. Screw 24 is screwed into hollow 22a beyond the opening of vacuum passage 26 so as to form a vacuum port 25 at the inlet of hollow 22a. Vacuum passage 26 is connected to a vacuum pump 27. A vacuum sensor 28 is disposed in vacuum passage 26. A thermosensor 29, e.g., a thermocouple, is placed at the lower end of suction block 22. A stop screw 30 is provided at the top end of main body 21. An end 32a of a lever 32 engages suction block 22. Lever 32 is rotatable about a fulcrum 31. A piston 33 engages an end 32b of lever 32. Reciprocative movement in the direction of arrows A of a piston rod 33a of piston 33 is transmitted to suction block 22 through lever 32 so that suction block 22 reciprocates in the direction of arrows B. A tension spring 34 always forces suction block 22 downward. A semiconductor device to be tested is placed on pallet 35. A number of leads 37 projecting from the bottom surface of semiconductor device 36 are disposed within opening 35a of pallet 35. Holding means 38 is provided at the lower end of main body 21. Holding fingers 38a hold semiconductor device 36 chucked by suction block 22 at both sides thereof. Each finger 38a can slide along rod 39. Holding fingers 38a are interchangeable in accordance with the shape and the size of the semiconductor device to be tested. Holding means 38 is actuated by a piston 40 through a lever 41, which is rotatable about fulcrum a 42. When a piston rod 40a of piston 40 projects downward in the direction of arrow C, engaging portion 41a of lever 41 is pushed downward in the direction of arrow D so that the end of lever 41 moves in the direction of arrow E, with the result that holding fingers 38a are pushed outward. When piston rod 40a is retracted, holding fingers 38a are forced to move inward by the force of springs 43 so that fingers 38a hold the semiconductor device. Guide grooves 44 into which guide pins of the testing portion (not shown) first are formed in main body 21. Main body 21 is secured to a arm 51, which is actuated by a servomotor 50. Another servomotor may be provided so as to move main body 21 in a direction perpendicular to the drawing. Thermosensor 29 is connected to a register 46 through an A/D converter 45 so that the temperature data is temporarily memorized by register 46. Register 46 is connected to a central processing unit 46, to which a memory 47 is also connected. Memory 47 memorizes experimental data concerning the relationship between the optimum switching time of heater block 23 actuated by a switch 48 and the condition of the vacuum chuck, the temperature detected by thermosensor 29, the kind of semiconductor device to be tested, and the setting temperature at which testing is to be conducted. Information concerning the condition of the vacuum chuck, the kind of semiconductor device to be tested, the setting temperature, and the position of the testing portion are input into central processing unit 46 through a line (a). Central processing unit 46 judges the optimum switching time of switch 48 on the basis of the data of memory 47 in response to the input information from register 46 and the line (a). Central processing unit 46 also controls servomotor 50 through a register (encoder) 49 so as to convey the vacuum chuck to a predetermined position.

Figure 5:
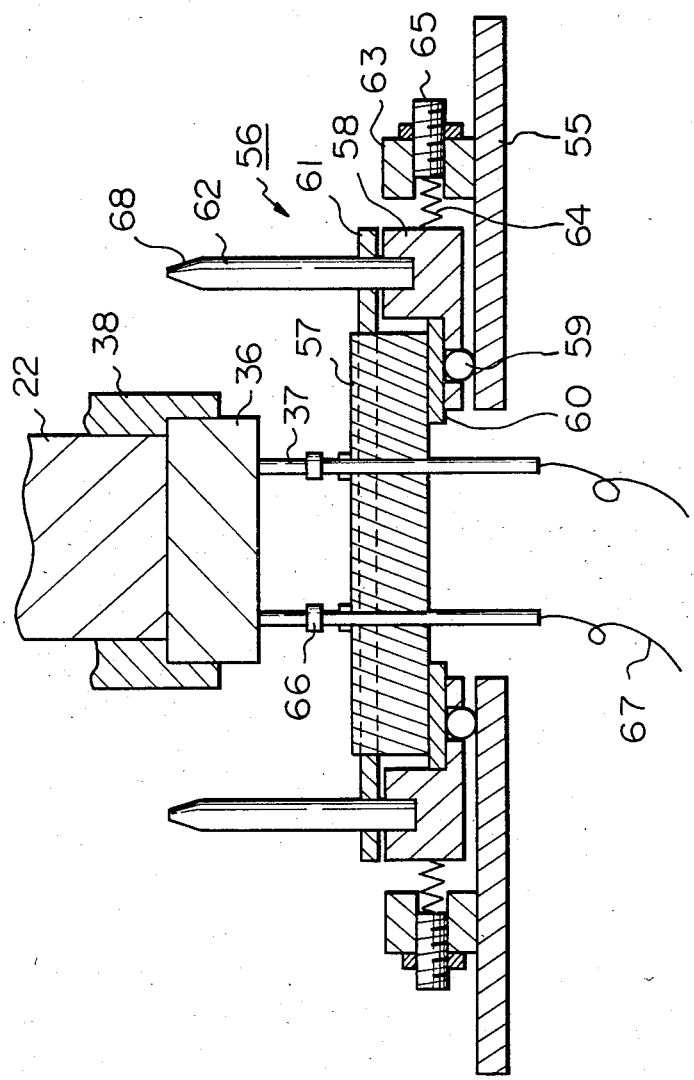
FIG. 5 is a sectional view of a positioning mechanism of the testing device according to the present invention.

Semiconductor device 36 is conveyed to a socket 56 (illustrated in FIG. 5) of the testing portion. Socket 56 is mounted on a base member 55 and comprises: a socket plate 57; a socket plate support 58, which receives socket plate 57 through a seat 60; and metal balls 59 for ensuring smooth movement of support 58 on base member 55. Socket plate 57 is held down on support 58 by pressing plate 61. Support 58 has guide pins 62 for positioning the vacuum chuck, which conveys the semiconductor device to be tested. Support 58 is supported on outer frames 63 by springs 64. Adjuster screws 65 for adjusting the strength of springs 64 are disposed on outer frames 63. Socket plate 57 has a number of terminals 66 corresponding to leads 37 of semiconductor device 36 to be tested. Each terminal 66 is connected to a tester (not shown) through lead wire 67. Socket plate 57 is exchanged for another socket plate of a different size in accordance with the kind of semiconductor device to be tested. Each guide pin 62 has a tapered top end 68 so that it is firmly inserted into each guide groove 44 (FIG. 4) of the vacuum chuck, even if the vacuum chuck diverges from the predetermined position.

Semiconductor device 36 to be tested is placed on pallet 35 and is heated in a heating portion (not shown) to a predetermined temperature. Heated semiconductor device 36 is held by the vacuum chuck of FIG. 4 and is conveyed to socket 56 (FIG. 5) of the testing portion. The relative position of semiconductor device 36 held by holding means 38 and guide grooves 44 is predetermined so that it is the same as the relative position of terminals 66 and guide pins 62. This makes it possible to precisely position each lead 37 of semiconductor device 36 on terminal 66 of terminal plate 57. Semiconductor device 36 is reliably positioned at a predetermined position even if the vacuum chuck diverges from the predetermined position since the divergence is compensated for by springs 64. Therefore, an inexpensive servomotor can be utilized without degrading the accuracy of positioning of the semiconductor device to be tested at the testing portion, with the result that an expensive, highly accurate positioning mechanism is unnecessary.

As aforementioned, the vacuum chuck of the autohandler of the testing device according to the present invention comprises a temperature control means actuated by a microcomputer so that the temperature is maintained at a predetermined temperature during conveyance of and testing of the semiconductor device, with the result that the reliability of the test results is increased and the quality of the products is upgraded.

We claim:

1. A system for testing semiconductor devices at a high temperature comprising: a heating portion where the semiconductor device to be tested is heated to a predetermined temperature; a testing portion where the semiconductor device is tested; means for chucking said semiconductor device, the chucking means having means for heating the semiconductor device and a thermosensor for the semiconductor device; means for conveying said semiconductor device chucked by the chucking means from the heating portion to the testing portion; and means for controlling the temperature of the heating means installed within said chucking means in response to the output of said thermosensor.

2. A system according to claim 1, in which said temperature controlling means comprises a central processing unit, and a memory circuit connected to said central processing unit for memorizing data concerning the control conditions.

3. A system according to claim 1, in which said temperature controlling means comprises a vacuum chuck comprising a suction block and a heater housed in said suction block.

4. A system according to claim 3, in which said vacuum chuck further comprises an exchangeable holding means for holding the semiconductor device sucked by said suction block.

5. A system according to claim 1, in which the testing portion comprises a socket having guide pins, spring means for supporting said socket in such a manner that said socket is movable in a horizontal plane, and said chucking means further comprises guide grooves for inserting said guide pins.

6. A system according to claim 5, in which said socket comprises: a socket plate having a number of terminals corresponding to leads of the semiconductor device to be tested; a support plate for receiving said socket plate; a stationary base member; and metallic balls for ensuring smooth movement of said support plate on the stationary base member; outer frames secured to said base member; and springs connecting said support plate to said outer frames.

7. A system according to claim 6, in which said socket plate is exchangeable.

8. The system of claim 2, wherein said chucking means comprises a vacuum chuck having a suction block, and a vacuum sensor, said heating means including a heater element housed in said suction block, said thermosensor including a sensor element housed in said suction block and connected to said memory circuit, and said temperature controlling means including a switch connected to said central processing unit for regulating the heater element in said suction block, the central processing unit controlling the switching time of said switch on the basis of data from said memory circuit, the memory circuit memorizing data concerning the relationship between the optimum time of the heater element actuated by said switch and the vacuum condition of the vacuum chuck, the type of semiconductor to be tested, the temperature detected by the thermosensor element, the temperature set for testing of the semiconductor device, and the position of the testing portion.

9. The system of claim 8, wherein said switch is a high speed switch.

10. The system of claim 8, wherein said conveying means includes a servomotor actuated by said central processing unit, said central processing unit controlling said servomotor for conveying said vacuum chuck with the semiconductor device to predetermined positions.

* * * * *

UNITED STATES PATENT AND TRADEMARK OFFICE
CERTIFICATE OF CORRECTION

PATENT NO. : 4,604,572
DATED : August 5, 1986
INVENTOR(S) : Horiuchi et al.

It is certified that error appears in the above-identified patent and that said Letters Patent is hereby corrected as shown below:

Front Page [57] ABSTRACT line 4, "a Assembly" should be --a Chucking Assembly--;

line 5, "the Chucking" should be --the--.

Column 1, line 55, "rail. the" should be --rail. The--.

Column 3, line 2, "therof" should be --thereof--;

line 23, "maintained" should be --be maintained--;

line 42, "fowarded" should be --forwarded--.

Column 4, lines 45 and 46, "fulcrum a 42" should be --fulcrum 42--;

line 56, "a" should be --an--.

Signed and Sealed this

Eleventh Day of November, 1986

*Attest:*

DONALD J. QUIGG

*Attesting Officer*      *Commissioner of Patents and Trademarks*